United States Patent
Thorn et al.

(10) Patent No.: US 6,171,468 B1
(45) Date of Patent: *Jan. 9, 2001

(54) DIRECT METALLIZATION PROCESS

(75) Inventors: Charles Edwin Thorn, Newport, KY (US); Frank Polakovic, Plymouth, MN (US); Charles A. Mosolf, Juno Beach, FL (US)

(73) Assignee: Electrochemicals Inc., Maple Plain, MN (US)

( * ) Notice: Under 35 U.S.C. 154(b), the term of this patent shall be extended for 0 days.

This patent is subject to a terminal disclaimer.

(21) Appl. No.: 08/975,613

(22) Filed: Nov. 21, 1997

Related U.S. Application Data

(63) Continuation-in-part of application No. 08/471,871, filed on Jun. 7, 1995, now Pat. No. 5,690,805, which is a continuation-in-part of application No. 08/340,849, filed on Nov. 16, 1994, now abandoned, which is a continuation-in-part of application No. 08/232,574, filed on May 3, 1994, now Pat. No. 5,476,580, which is a continuation-in-part of application No. 08/062,943, filed on May 17, 1993, now Pat. No. 5,389,270.

(51) Int. Cl.$^7$ ................ C25D 5/02; C25D 5/54; B05D 5/12; B05D 1/18

(52) U.S. Cl. ............ 205/118; 205/159; 205/125; 205/162; 205/164; 205/166; 427/122; 427/443.2; 427/430.1; 427/421; 427/427

(58) Field of Search ............... 427/96, 97, 98, 427/122, 443.2, 430.1, 421, 427; 205/159, 125, 162, 164, 166

(56) References Cited

U.S. PATENT DOCUMENTS

| | | | |
|---|---|---|---|
| 409,096 | 8/1889 | Blank | 205/159 |
| 1,037,469 | 9/1912 | Goldberg | 427/123 |
| 2,176,879 | 10/1939 | Bartell | 44/9 |
| 2,243,429 | 5/1941 | Laux | 204/30 |
| 2,692,857 | 10/1954 | Michel et al. | 252/28 |
| 2,833,736 | 5/1958 | Glaser | 260/29.6 |
| 2,872,391 | 2/1959 | Hauser et al. | 204/15 |
| 2,897,409 | 7/1959 | Gitto | 317/101 |
| 2,978,428 | 4/1961 | Aberegg | 260/29.6 |
| 2,983,220 | 5/1961 | Dalton et al. | 101/149.2 |
| 3,099,608 | 7/1963 | Radovsky et al. | 204/15 |
| 3,152,996 | 10/1964 | Forrester | 252/313 |
| 3,163,588 | 12/1964 | Shortt et al. | 204/16 |
| 3,249,559 | 5/1966 | Gallas | 252/510 |
| 3,495,962 | 2/1970 | Norton | 65/26 |
| 3,506,482 | 4/1970 | Hirohata et al. | 117/212 |
| 3,509,088 | 4/1970 | Dalton | 260/41 |
| 3,515,201 | 6/1970 | Zimmerman | 164/66 |
| 3,518,116 | 6/1970 | Stock et al. | 117/226 |
| 3,565,658 | 2/1971 | Frazier et al. | 106/307 |
| 3,578,577 | 5/1971 | Gilchrist | 204/181 |
| 3,639,121 | 2/1972 | York | 96/1.5 |
| 3,655,530 | 4/1972 | Taylor | 204/26 |
| 3,696,054 | 10/1972 | Saunders | 252/511 |
| 3,697,450 | 10/1972 | Takenaka et al. | 252/511 |
| 3,725,214 | 4/1973 | Bride | 204/15 |
| 3,764,280 | 10/1973 | Lupinski | 29/195 |
| 3,818,412 | 6/1974 | Deardurff | 338/214 |
| 3,852,131 | 12/1974 | Houston | 156/3 |

(List continued on next page.)

FOREIGN PATENT DOCUMENTS

| | | |
|---|---|---|
| 2102240 | * 10/1992 | (CA) . |
| 0 085 413 A2 | 8/1983 | (EP) . |
| 0 381 761 A1 | 8/1990 | (EP) . |
| 0 752 807 A1 | 1/1997 | (EP) . |
| 0 759 482 A1 | 2/1997 | (EP) . |
| 1136977 | 12/1968 | (GB) . |
| 1176597 | 1/1970 | (GB) . |
| 1506464 | 4/1978 | (GB) . |
| 2177707 | 1/1987 | (GB) . |
| 60-110893 | 11/1983 | (JP) . |
| 571435 | 9/1977 | (SU) . |
| 674981 | 7/1979 | (SU) . |
| 745964 | 7/1980 | (SU) . |
| 768793 | 11/1980 | (SU) . |
| 943333 | 7/1982 | (SU) . |
| WO 92/19092 | 10/1992 | (WO) . |

OTHER PUBLICATIONS

Acheson—Product Data Sheet "Dag 137 Graphite Lubricating Coating," Acheson Colloids Company, Port Huron, Michigan 48060, 2 pages, No Date Available.

(List continued on next page.)

* cited by examiner

*Primary Examiner*—Edna Wong
(74) *Attorney, Agent, or Firm*—McAndrews, Held & Malloy, Ltd.

(57) ABSTRACT

A method of applying a conductive carbon coating to a non-conductive surface, conductive carbon compositions for that purpose, and a printed wiring board having through holes or other nonconductive surfaces treated with such carbon compositions are disclosed. A liquid dispersion of electrically conductive carbon (for example, graphite) having a mean particle size no greater than about 50 microns is coated on the non-conductive surface to form an electrically conductive carbon coating. The conductive carbon coating is then fixed on the (formerly) nonconductive surface. Fixing may be accomplished in a variety of different ways. For example, the fixing step can be carried out by applying a fixing liquid to the carbon-coated surface. One example of a suitable fixing liquid is a dilute aqueous acid. Fixing may also be carried out by removing the excess carbon dispersion with an air knife or other source of compressed air. The fixing process removes excessive carbon composition deposits, and thus smooths the carbon coating on the recess surfaces by eliminating lumps and by making the coating more uniform. Fixing can also crosslink the first monolayer of carbon which is directly attached to the substrate or an aqueous organic binding agent associated with the coating. The resulting coating has a low electrical resistance and is tenacious enough to be plated and exposed to molten solder without creating voids or losing adhesion.

28 Claims, No Drawings

U.S. PATENT DOCUMENTS

| | | | |
|---|---|---|---|
| 3,865,626 | 2/1975 | Diener et al. | 117/226 |
| 3,865,699 | 2/1975 | Luch | 204/20 |
| 3,870,987 | 3/1975 | Wiley et al. | 338/214 |
| 3,874,862 | 4/1975 | Bickling, Jr. et al. | 65/26 |
| 3,881,048 | 4/1975 | Bertrand | 428/447 |
| 3,963,498 | 6/1976 | Trevoy | 96/87 A |
| 3,966,581 | 6/1976 | Holte | 204/202 |
| 3,983,042 | 9/1976 | Jain et al. | 252/18 |
| 3,991,397 | 11/1976 | King | 338/214 |
| 4,000,046 | 12/1976 | Weaver | 204/38 R |
| 4,035,265 | 7/1977 | Saunders | 252/510 |
| 4,090,984 | 5/1978 | Lin et al. | 252/511 |
| 4,104,178 | 8/1978 | Jain et al. | 252/30 |
| 4,105,513 | 8/1978 | Nishino et al. | 204/38 A |
| 4,187,334 | 2/1980 | LaBate | 427/236 |
| 4,205,974 | 6/1980 | Franz | 65/40 |
| 4,213,870 | 7/1980 | Loran | 252/51.5 R |
| 4,239,794 | 12/1980 | Allard | 428/219 |
| 4,239,818 | 12/1980 | LaBate | 427/236 |
| 4,254,180 | 3/1981 | Kline | 428/323 |
| 4,278,511 | 7/1981 | Dugan | 204/15 |
| 4,316,831 | 2/1982 | LaBate | 260/29.6 S |
| 4,321,295 | 3/1982 | Smith-Johannsen | 428/206 |
| 4,368,252 | 1/1983 | Kakuhashi et al. | 430/312 |
| 4,389,278 | 6/1983 | Kai | 156/630 |
| 4,401,579 | 8/1983 | Kratzer | 252/17 |
| 4,416,790 | 11/1983 | Schürmann et al. | 252/62 |
| 4,424,930 | 1/1984 | Wilhelmson | 228/20 |
| 4,425,380 | 1/1984 | Nuzzi et al. | 427/97 |
| 4,430,166 | 2/1984 | Carter | 204/15 |
| 4,462,922 | 7/1984 | Boskamp | 252/174.12 |
| 4,465,565 | 8/1984 | Zanio | 204/56 R |
| 4,478,368 | 10/1984 | Yie | 239/430 |
| 4,529,683 | 7/1985 | Bishop | 430/215 |
| 4,547,311 | 10/1985 | Sako et al. | 252/511 |
| 4,571,286 | 2/1986 | Penato | 204/15 |
| 4,581,301 | 4/1986 | Michaelson | 428/551 |
| 4,617,579 | 10/1986 | Sachdev et al. | 346/135.1 |
| 4,619,741 | 10/1986 | Minten et al. | 204/15 |
| 4,619,871 | 10/1986 | Takami | 428/607 |
| 4,622,107 | 11/1986 | Piano | 204/15 |
| 4,622,108 | 11/1986 | Polakovic et al. | 204/15 |
| 4,629,537 | 12/1986 | Hsu | 204/15 |
| 4,631,117 | 12/1986 | Minten et al. | 204/15 |
| 4,634,619 | 1/1987 | Lindsay | 427/97 |
| 4,683,036 | 7/1987 | Morrissey et al. | 204/15 |
| 4,684,560 | 8/1987 | Minten et al. | 428/131 |
| 4,691,091 | 9/1987 | Lyons et al. | 219/121 LM |
| 4,718,993 | 1/1988 | Cupta et al. | 204/15 |
| 4,724,005 | 2/1988 | Minten et al. | 106/307 |
| 4,735,676 | 4/1988 | Iwasa | 156/630 |
| 4,735,734 | 4/1988 | Staub et al. | 252/29 |
| 4,758,358 | 7/1988 | Lum et al. | 252/22 |
| 4,786,198 | 11/1988 | Zgambo | 106/20 X |
| 4,790,902 | 12/1988 | Wada et al. | 156/630 |
| 4,808,324 | 2/1989 | Periard et al. | 252/23 |
| 4,818,437 | 4/1989 | Wiley | 252/511 |
| 4,818,438 | 4/1989 | Wiley | 252/511 |
| 4,820,344 | 4/1989 | Geke et al. | 106/14.13 |
| 4,867,792 | 9/1989 | Ronlan | 106/189 |
| 4,874,477 | 10/1989 | Pendleton . | |
| 4,879,015 | 11/1989 | Adamek et al. | 204/224 R |
| 4,889,750 | 12/1989 | Wiley | 428/342 |
| 4,897,164 | 1/1990 | Piano et al. | 204/15 |
| 4,911,796 | 3/1990 | Reed | 204/15 |
| 4,921,777 | 5/1990 | Fraenkel et al. | 430/314 |
| 4,935,109 | 6/1990 | Dugan | 204/15 |
| 4,964,948 | 10/1990 | Reed | 156/659.1 |
| 4,964,959 | 10/1990 | Nelson et al. | 204/15 |
| 4,969,979 | 11/1990 | Appelt et al. | 204/15 |
| 4,980,202 | 12/1990 | Brennan et al. | 427/249 |
| 4,994,153 | 2/1991 | Piano et al. | 204/15 |
| 5,015,339 | * 5/1991 | Pendleton | 204/15 |
| 5,018,979 | 5/1991 | Gilano et al. | 434/409 |
| 5,024,735 | 6/1991 | Kadija | 204/15 |
| 5,026,616 | * 6/1991 | Schumm, Jr. | 429/168 |
| 5,030,367 | 7/1991 | Tanaka et al. | 252/22 |
| 5,032,235 | 7/1991 | Downing et al. | 204/15 |
| 5,041,242 | 8/1991 | Fowle et al. | 252/511 |
| 5,057,245 | 10/1991 | Frentzel et al. | 252/511 |
| 5,106,537 | 4/1992 | Nelsen et al. | 252/502 |
| 5,108,553 | 4/1992 | Foster et al. | 205/125 |
| 5,110,355 | 5/1992 | Penleton | 106/1.11 |
| 5,139,642 | 8/1992 | Randolph et al. | 205/125 |
| 5,160,375 | * 11/1992 | Otaki | 106/475 |
| 5,234,627 | 8/1993 | Damschroder | 252/502 |
| 5,262,041 | 11/1993 | Gulla | 205/125 |
| 5,277,787 | 1/1994 | Otani et al. | 205/125 |
| 5,389,270 | 2/1995 | Thorn et al. | 252/22 |
| 5,391,421 | 2/1995 | Gulla | 428/209 |
| 5,468,597 | 11/1995 | Calabrese et al. | 430/315 |
| 5,476,580 | * 12/1995 | Thorn et al. | 205/122 |
| 5,484,518 | 1/1996 | Goldberg | 205/166 |
| 5,494,610 | 2/1996 | Lovell | 252/511 |
| 5,498,372 | 3/1996 | Hedges | 252/511 |
| 5,500,106 | 3/1996 | Goldberg | 205/166 |
| 5,536,386 | 7/1996 | Ferrier et al. | 205/125 |
| 5,547,558 | 8/1996 | Sakamoto et al. | 205/125 |
| 5,549,849 | 8/1996 | Namura et al. | 252/503 |
| 5,622,652 | 4/1997 | Kucherovsky et al. | 252/511 |
| 5,690,805 | 11/1997 | Thorn et al. | 205/118 |
| 5,738,776 | * 4/1998 | Florio et al. | 205/118 |

OTHER PUBLICATIONS

Acheson—Product Data Sheet "Electrodag® 230 Conductive Impregnant," Acheson Colloids Company, Port Huron, Michigan 48060, 2 pages, No Date Available.

Acheson—"Electrodag® Coatings Selection Guide," Acheson Colloids Company, P.O. Box 611747, Port Huron, Michigan 48061–1747, No Date Available.

Acheson—Product Data Sheet "Aquadag,", No Date Available.

Aqualon, CMC Aqualon Cellulose Gum Sodium Carboxymethycellulose, Physical and Chemical Properties, 5 pages, No Date Available.

Aqualon, Klucel Hydroxypropylcellulose, Physical and Chemical Properties, 28 pages, No Date Available.

Aqualon, Natrosol Hydroxyethycellulose A Nonionic Water-–Soluble Polymer Physical and Chemical Properties, Aqualon pp. 1–5, No Date Available.

Aqualon, Technical Information "Freezer Gel Preparation With Aqualon™ CMC," Bulletin VC–521 (Supersedes VC–405D), Aqualon Company,1313 North Market Street, Wilmington, Delaware 19894, 2 pages, No Date Available.

Aquaness Chemical Technical Information, "ARKLEAR 155" 1 page, No Date Available.

Aquaness Chemical Technical Information, "ARKLEAR 1055" 1 page, No Date Available.

Asakawa, et al., "Adsorption of Phenol on Surface–modified Carbon Black from its Aqueous Solution. II. Influence of Surface–Chemical Structure of Carbon on Adsorption of Phenol," *Bull. Chem. Soc. Jpn.* 58:2009–2014 (1985), No Month Available.

Bernhardt, "Preparation of Suspensions for Particle Size Analysis Methodical Recommendations, Liquids and Dispersing Agents," *Advances in Colloid and Interface Science,* 29:79–139 (1988), No Month Available.

Bose, et al., "Preparation, Voltammetric Characterization, and Use of a Composite Containing Chemically Synthesized Polypyrrole and a Carrier Polymer," *J. Electrochem, Soc.,* 139(9):L75–L76 (Sep. 1992).

Brédas, "Electronic Structure of Highly Conducting Polymers," Facultés Universitaires Notre–Dame de la Paix, Namur, Belgium, 25:859–912, No Date Available.

Chaurasia, et al., "Thermal Conductivity of Supension and Emulsion Materials," *J. Appl. Chem. Biotechnol.,* 25(12): 881–890 (1975), No Month Available.

Comello, "R&D Semiconductor Research, Conducting Polymers Finding Niche Uses," *R&D* Magazine, pp. 63–64 (Jul. 1993).

Dagani, "Organic Metals: New polymers are most metallic yet," News of the Week, C&EN, pp. 8–9 (Aug. 31, 1992).

Daxad, High Activity Dispersants, Technical Data CP–2, Organic Chemicals Division, W.R. Grace & Co., Lexington, Mass. 02173, 1 page, No Date Available.

Dean, Lange's Handbook of Chemistry, McGraw–Hill, Inc., 14$^{th}$ ed., pp. 8.103–8.107 (Month of publication is unknown.) ©1956.

Dow Chemical Company, Methocel Cellulose Ethers, Binders and processing aids for ceramics, 4 pages, No Date Available.

Dow Chemical Co., Selecting the Best Versene Chelating Agent, (undated).

Dovgyalo, et al., "Electric mass transfer of dispersed conducting carbon black–polyethylene compositions during electrostatic fluidized–bed deposition," *Inzh.–Fiz. Zh.* 57(4):639–44 (1989) Abstract No. C A112(16):141269 (Abstract Only), No Month Available.

Encyclopedia of Science and Engineering, Cellular Materials to Composites, John Wiley & Sons, vol. 3, pp. 235–243. (Month not known.) ©1985.

Exxon Chemical, Callaway 6818, 2 pages (May 30, 1991).

Fluorad® Technical Information—Fluorochemical Surfactants FC–120, 3M Industrial Chemical Products Division, (Mar. 1992).

Gottesfeld, et al., "The Application of a Polypyrrole Precoat for the Metallization of Printed Circuit Boards," *J. Electrochem. Soc.,* 139(1):L14–L16 (Jan. 1992).

Grafo Bulletin, Dispersion of Graphite and Other Solids for Industrial Coating Applications, Grafo Coatings for the Electronic Industry (undated).

Grafo Bulletin, Dispersions of Graphite and Other Solids for Industrial Coating Applications, Products for Electronics (undated).

Groszek et al., "Heats of Adsorption of Gold Chloride and Cyanide Complexes from Aqueous Solutions on Graphitized Carbon Black and a Coconut Active Carbon," *Carbon,* 29(7):821–829 (1991), No Month Available.

Hercules, Chemical and Physical Properties of Hercules Ethycellulsoe, A Specialty Polymer With Broad Stability and Compatibility. Undated.

Hercules, Product Data, "Kymene® 736 Wet–Strength Resin and Retention Aid," No. 7576–1, (Supersedes 7576) Hercules Incorporated, Hercules Plaza, 1313 North Market Street, Wilmington, DE 19894–0001, No Date Available.

Hercules, Hercules, Nitrocellulose, The First Thermoplastic Polymer Made From a Renewable Resource, Chemical and Physical Properties, Undated.

Hercules Technical Information, "Polycup® Resins Crosslinking Agents for Latices and Water–Soluble Polymers," Bulletin NP–102A (Supersedes NP–102) pp. 1–4 Hercules Incorporated Hercules Plaza, Wilmington, DE 19894–0001, No Date Available.

Huang, et al., "Application of Conducting Polyaniline to the Electrolytic Plating Process," *ANTEC* pp. 864–867 (1991), No Month Available.

Hycar, High Performance Emulsions, Technical Data Hycar 26120 (8703) 0009n–27–30, No Date Available.

Hycar—Material Safety Data Sheet Hycar Acrylic Latex, Doc. 85134, Issued Jan., 1987 (Revised May 3, 1991), BF Goodrich Specialty Chemicals, 9911 Brecksville Road, Cleveland, Ohio 44141–3247.

Jara, et al., "Separation of carbon black from aqueous suspensions," Abstract No. 91:96226f, *60–Sewage, Wastes* 91:299 (1979), No Month Available.

JP Kokai No. 49–36429, Apr. 4, 1974.
JP Kokai No. 52–87694, Jul. 21, 1977.
JP Kokai No. 58–138795, Aug. 17, 1983.
JP Kokai No. 59–223769 Dec. 15, 1984.
JP Kokai No. 60–155280, Aug. 15, 1985.
JP Kokai No. 61–51097, Mar. 13, 1986.
JP Kokai No. 63–125580, May 28, 1988.
JP Kokai No. 1–219170, Sep. 1, 1989.
JP Kokai No. 2–151682, Jun. 11, 1990.
JP Kokai No. 2–258897, Oct. 19, 1990.
JP Kokai No. Hei 2–258897, Oct. 19, 1990.
JP Kokai No. Hei 3–207890, Sep. 11, 1991.
JP Kokai No. Hei 4–332774, Nov. 19, 1992.

Karmazina, et al. "Studies of Graphitized Black After Contact with Aqueous Solution of Surfactant by the Method of Slow Neutron Scattering," Chemistry and Technology of Water, 1991 T. 13, No. 8 pp. 678–681. (No Translation) (Abstract only translated), No Month Available.

Kelco, Technical Bulletin DB—15, Kelzan Xanthan Gum, 3 pages (1991), No Month Available.

Kirk Othmer, vol. 1 pp. 298–301, 312–313, 330–333, 386–388, 394–396, 427, 430, No Date Available.

Kirk Othmer, vol. 4, pp. 535–555, No Date Available.
Kirk Othmer, vol. 4, pp. 556–558, No Date Available.
Kirk Othmer, vol. 4, pp. 631–636, No Date Available.
Kirk–Othmer, Encyclopedia of Chemical Technology, 4$^{th}$ ed., vol. 4, 974–976, 1002–1003, 1063–1067, 1115, No Date Available.

Kirk–Othmer, vol. 9, pp. 61–88, No Date Available.
Kirk Othmer, vol. 9, pp.. 267–272, 274–280, 286 288, No Date Available.

Kirk Othmer, vol. 20, pp. 197–198, 200–201, 207–227, No Date Available.

Leeuw, et al., "Electroplating of conductive polymers for the metallization of insulators," *Synthetic Metals* 66:263–273 (1994), No Date Available.

Metal Lub. Grafo 1204B Interim Data Sheet (undated).

Moraru et al., Adsorption of oxyethylated nonionic surfactants and its effect on the stability of aqueous dispersions of graphite, Abstract No. 102:084887e, *66–Surface Chem, Colloids,* 102:397 (1985), No Month Available.

Moraru, et al., "Adsorption of Oxy–Ethylated Nonionic Surfactants and its Influence on the Stability of the Aqueous Dispersion of Graphite," *7 Colloid Journal,* 6:1148–1153, (abstract only translated), No Date Available.

Nakahara, "Additive Plating," Printed Circuits Handbook, Chapter 13, pp. 13.1–13.17, No Date Available.

Olin Hunt Specialty Products Inc. Operating Bulletin Rev. 1 (Jul. 1991), Olin Hunt, Blackhole Conveyor System Process II, pp. 1–27.

Olin Hunt Specialty Products Inc., Operating Bulletin Rev. 1 (Jul. 1991), Olin Hunt, Blackhole Vertical Process, pp. 26.

Polytec Incorporated, Product Data, "Polytec Cationic Polymers," Polytec Incorporated, PO Box 1247, Gulf Shores, Alabama 26547, 2 pages, No Date Available.

Rohm and Haas, Rohm and Haas Products for the Graphic Arts Industry, ACRYSOL I–1955, Rohm and Haas Company, 2 pages (1988), No Month Available.

Rohm and Haas, Rohm and Haas, Rohm and Haas Products for the Graphic Arts Industry, ACRYSOL I–543, 3 pages (Undated).

Sandoz Chemicals, Water Soluble Polymers, 2 pages (undated).

Sandu, et al., "Water–colloidal graphite disperse systems. I. Description of the components," *Rev. Chim. (Bucharest)*, 37(11):968–74 (1986) (Abstract Only), No Month Available.

Shestakova et al., Effect of the salt composition of process water on pH of aqueous carbon black suspensions, Abstract No. 9722a, *61—Water*, 79:307 (1973), No Month Available.

Takashina et al., "Carbon black composition dispersible in water," Abstract No. 138303p. *Chemical Abstracts*, 79:60 (1973), No Month Available.

Van Deraerschot, "Separation of carbon black from aqueous suspensions," Abstract No. 91:76784h, *Chemical abstracts*, 91:134 (1979), No Month Available.

Zhou, et al., "Unique Optical and Electrochemical Properties of π–Conjugated Electrically Conducting Copolymers Consisting of Electron–withdrawing Pyridine Units and Electron–donating Thiophene Units," *J. Chem. Soc. Chem. Commun*, 17:1210–1212 (1991), No Month Available.

Kadlec, et al. "Technical–grade carbon black from aqueous dispersions and carbon–containing heterogeneous mixtures," 188311 B—Jun. 15, 1981 Czech, Abstract Only.

Necesany, et al., "Recovery of solid carbon from aqueous dispersion," 206687 B—Sep. 15, 1983 Czech, Abstract Only.

Juracka, et al., "Compositions for formation of electrically conductive or semiconductive coatings," 259192 B1—Mar. 31, 1989 Czech, Abstract Only.

Bauer, et al., 294589 —Oct. 2, 1991 DD, Abstract Only.

Chiyoda, et al., "Coating composition based on graphite for the interior wall of a picture tube," 3,008,495 —Apr. 9, 1989 Germany, Abstract Only.

02/153811—00/00/90 Japan, Abstract Only, No Month Available.

76–005856—Feb. 23, 1976 Japan, Abstract Only.

Shibata, "Electrically No Month Available.No Date Available.conductiveNo Month Available.No Date Available. coating compositions for coating the inside of cathode ray tubes," 51067992—Jun. 12, 1976 Japan, Abstract Only.

Yoshimura, et al., "Electrically Conductive Coating Composition," 58–025368—Feb. 15, 1983 Japan, Abstract Only.

Sako, et al., "Electrically Conductive Paint Composition," 58–132058—Aug. 6, 1983 Japan, Abstract Only.

Showa, "Water resistant No Month Available.No Date Available.electroconductiveNo Month Available.No Date Available. paint," 58–194962—Nov. 14, 1983 Japan, Abstract Only.

Showa, "Coating Materials for metal melt–casting molds," 59–232648—A2 Dec. 27, 1984 Japan, Abstract Only.

Ozaki, et al., "Conductive Water–Disperse Coating," 60–156769—Aug. 16, 1985 Japan, Abstract Only.

Masakazu, et al., "Production of Electrically–Conductive Graphite Material," 61–127612—Jun. 14, 1986 Japan, Abstract Only.

Hisashi, "Formation of Conductive Coated Film," 61–161181—Jul. 21, 1986 Japan, Abstract Only.

"Hair dyeing agent—contg. E.g. triphenylmethane agent and/or azo agent and/or quinoline agent and carbon black," 1242518—Sep. 27, 1989 Japan, Abstract Only.

"Lubricant compsn. For high temps.—contains powdered graphite, water, and as binder, water–soluble polymer and water–dispersible polymer," 2051592—Jan. 21, 1990 Japan, Abstract Only.

Tada, et al., "Antifriction, abrasion–resistant electrophoretic coating compositions," 05117556—May 14, 1993 Japan,, Abstract Only.

Tatsuzono, et al., "Manufacture of electrically No Month Available.No Date Available.conductiveNo Month Available.No Date Available. coating materials for Braun tubes," 06240182—Aug. 30, 1994 Japan, Abstract Only.

Ryzhkov, et al., "Parting Coating," 414039—Feb. 5, 1974 USSR, Abstract Only.

Medrikov, et al., "Aqueous carbon black dispersion," 768793—Oct. 7, 1980—USSR, Abstract Only.

Akhremenko et al., "Lubricant for roller–less conveyor belt moving in groove—contains graphite, foaming agent, and additional alkali salts of higher fatty acids, to stabilise lubricating properties," 1498786—Aug. 7, 1989 USSR, Abstract Only.

Sokirko, et al., "Lubricant for hot pressure forming of metals—contains graphite, fireclay, additional synthetic detergent, and water," 1579929—Jul. 23, 1990—USSR, Abstract Only.

Chiyoda, et al., "Coating composition based on graphite for the interior wall of a picture tube," 3008495—Apr. 9, 1981—DE, Abstract Only.

Borden, "Durite" Phenolic Resin, AL–5801A, Borden Packaging and Industrial Products, Feb. 1991.

Graden Chemical Company, Inc., "Densefloc 30, Polymeric Flocculating Agent for Water Treatment," (Undated).

IPC–QE–605, pp. 6–7, 9–10, –12–25, 27, 29, 32, 35–36, 40, 52, 61, 70 (Oct. 1985).

DIRECT METALLIZATION PROCESS

CROSS-REFERENCE TO RELATED APPLICATIONS

This is a continuation-in-part of U.S. Ser. No. 08/471,871, filed Jun. 7, 1995, now U.S. Pat. No. 5,690,805, which is a continuation-in-part of U.S. Ser. No. 08/340,849, filed Nov. 16, 1994, now abandoned, which is a continuation-in-part of U.S. Ser. No. 08/232,574, filed May 3, 1994, now U.S. Pat. No. 5,476,580, which in turn is a continuation-in-part of U.S. Ser. No. 08/062,943, filed May 17, 1993, now U.S. Pat. No. 5,389,270. The entire specification and all the claims of each prior application referred to above are hereby incorporated by reference to provide continuity of disclosure.

BACKGROUND OF THE INVENTION

The present invention is directed to printed wiring boards having recesses, or other non-conductive substrates, made electrically conductive by applying a coating containing carbon, preferably graphite, to an initially nonconductive through hole or other substrate.

Additional background information may be found from page 2, line 1, to page 10, line 21, of U.S. Ser. No. 08/471,871, filed Jun. 7, 1995, now U.S. Pat. No. 5,690,805. That text is hereby incorporated by reference in the present disclosure.

SUMMARY OF THE INVENTION

An object of the present invention is to improve the deposition of a thin and uniform coating of graphite or carbon black (which are referred to in this specification either together or separately as "carbon") particles on a non-conductive surface, such as the wall of a through hole, "via" (which is a blind hole), another type of recess, or some other surface.

As used herein, a "uniform" coating is one essentially free of excess conductive coating composition build up, particularly at the opening(s) of a recess, so the coating has a substantially uniform thickness at the mouth and in the interior of the recess, as viewed under a 50× magnification of a cross-section of a recess after plating.

Still another object of the present invention is to provide an electroplated conductive through hole coating which is capable of withstanding the solder shock test.

A still further object of the invention is to provide a conductive carbon coating with a low resistivity.

Other objects of the invention will become apparent to one skilled in the art who has the benefit of this specification and the prior art.

One aspect of the present invention, which meets one or more of the above objects, is a method of applying an electrically conductive carbon coating to a non-conductive surface. A substrate is provided having at least one non-conductive surface. An example of such a substrate is the wall of a through hole or via drilled or otherwise formed in the non-conductive substrate for a printed wiring board. A liquid dispersion of electrically conductive carbon is also provided. The carbon dispersion has a mean particle size no greater than about 50 microns.

The carbon dispersion is applied to the non-conductive surface to form a substantially continuous, electrically conductive carbon coating. The carbon in the dispersion is present in an amount effective to provide an electrically conductive coating.

Next, the conductive carbon coating is fixed on the (formerly) nonconductive surface. ("Fixing" is defined below in the detailed description.) Typically, fixing is carried out after the carbon dispersion is applied, without drying the carbon coating first.

Fixing may be accomplished in a variety of different ways. For example, the fixing step can be carried out by applying a fixing liquid to the carbon-coated surface. One example of a suitable fixing liquid is a dilute aqueous acid maintained at a pH between about 0.01 and about 6. Other suitable fixing liquids are described later in this specification. For another example, fixing may be carried out by removing the excess carbon dispersion with an air knife or other source of compressed air.

The fixing process removes excessive carbon composition deposits, and thus smooths the carbon coating on the recess surfaces by eliminating lumps and by making the coating more uniform. Certain liquid fixing agents also crosslink the first monolayer of carbon which is directly attached to the substrate or an aqueous organic binding agent associated with the coating. Crosslinking these coatings improves adhesion without interfering with microetching. Microetching selectively removes the carbon coating from metallic surfaces, without removing it from nonmetallic surfaces such as the substrate of a printed wiring board.

An alternative aspect of the invention is a method of applying a conductive graphite coating to a non-conductive surface. A substrate having at least one recess having a non-conductive surface is coated with a synthetic graphite dispersion to form a substantially continuous, electrically conductive graphite coating having an electrical resistivity of less than about 1000 ohms.

In still another alternative aspect of the invention the graphite dispersion contains from about 1% to about 7% by weight of electrically conductive graphite (whether natural or synthetic).

In yet another alternative aspect of the invention the graphite dispersion contains from about 0.01% to about 10% by weight of a water dispersible organic binding agent.

DETAILED DESCRIPTION OF THE INVENTION

While the invention will be described in connection with one or more preferred embodiments, it will be understood that the invention is not limited to those embodiments. On the contrary, the invention includes all alternatives, modifications, and equivalents as may be included within the spirit and scope of the appended claims.

The present invention is carried out by providing and using a conductive carbon dispersion. A detailed description of the ingredients of the dispersion and how it is made and used follows. Additional disclosure is provided from page 14, line 9, to page 58, line 9, of U.S. Ser. No. 08/471,871, filed June 7, 1995, now U.S. Pat. No. 5,690,805. That text is hereby incorporated by reference in the present disclosure.

Carbon

One component of the present conductive compositions is electrically conductive carbon, for example, carbon black, graphite, or combinations of the two.

The electrically conductive carbon particles should be present in an amount effective to provide an electrically conductive coating when the composition is applied to a substrate. The carbon may be present as from about 0.1 to about 20% by weight, alternatively from about 0.5 to about 10% by weight, alternatively from about 1% to about 7% by weight, alternatively from greater than about 4% to about 6.5% by weight of the composition.

The carbon may have a mean particle size within the range from about 0.05 to about 50 microns, alternatively from about 0.3 to 1.0 microns, alternatively from about 0.7 to about 1.0 microns. From the perspective of performance and ease of dispersion, particles from the smaller end of the size range are preferred. However, the smaller particles, particularly graphite particles, are more costly. The inventors have found it unnecessary to obtain graphite having mean particle sizes substantially less than one micron, contrary to the conventional belief that extremely fine graphite is necessary.

The carbon black useful herein can be substantially as described in U.S. Pat. No. 5,139,642. The carbon black description of that patent is hereby incorporated herein by reference in its entirety. Several commercial carbon blacks contemplated to be useful herein include CABOT MONARCH 1300, sold by Cabot Corporation, Boston, Mass.; CABOT XC-72R Conductive, from the same manufacturer; ACHESON ELECTRODAG 230, sold by Acheson Colloids Co., Port Huron, Mich.; COLUMBIAN RAVEN 3500, made by Columbian Carbon Co., New York City, N.Y.; and other conductive carbon blacks having similar particle sizes and dispersion characteristics.

The graphite useful herein can be substantially as, described in U.S. Pat. No. 5,139,642. The graphite description of that patent is hereby incorporated herein by reference in its entirety. In the present compositions, the graphite may be either synthetic or naturally occurring. Accordingly, suitable commercial graphite and graphite dispersions contemplated to be useful herein include: ULTRAFINE GRAPHITE, sold by Showa Denko K. K., Tokyo, Japan; AQUADAGE E; MICRO 440, sold by Asbury Graphite Mills Inc., Asbury, N.J.; GRAPHITE 850, also sold by Asbury; GRAFO 1204B, sold by Metal Lubricants Company, Harvey, Ill.; GRAPHOKOTE 90, sold by Dixon Products, Lakehurst, N.J.; NIPPON AUP (0.7 micron), sold by Nippon Graphite Industries, Ltd., Ishiyama, Japan; and others having similar electrical and dispersion characteristics.

Aqueous dispersions of carbon black or graphite are well known in the art and in related arts, such as lubricating compositions and conductive coatings for other purpose.

Binding Agent

Another component of some of the present compositions is a water soluble or dispersible binding agent for binding the carbon particles. The binding agent is believed to assist the dispersed carbon particles in adhering to the surface of the non-conductive (i.e., dielectric) substrate which is to be made conductive for electroplating. The binding agent should be present in an amount effective to bind the carbon particles to a substrate. The binding agent may be present as from about 0% to about 15% by weight, or from about 0.2 to about 10% by weight, or from about 0.5% to about 6% by weight, or from about 1.5% to about 3% by weight, of the composition for binding to the carbon particles.

The binding agent is preferably any natural or synthetic polymer, polymerizable monomer, or other viscous or solid material (or precursor thereof) that is capable of both adhering to the carbon particles and of receiving an anionic dispersing agent (as described below). Alternatively, the binding agent can be capable of dispersing the carbon particles to which it adheres in the aqueous medium of the dispersion. For example, the birding agent may be a water soluble or water dispersible material selected from the group consisting of mono- and polysaccharides (or, more broadly, carbohydrates) and anionic polymers. Polysaccharide (which for the present purposes includes disaccharide and higher saccharide) binding agents contemplate for use herein include corn starch, other starches, and polysaccharide gums. Polysaccharide gums contemplated for use herein include agar, arabic, xanthan (for example, KELZAN industrial grade xanthan gum, available from the Kelco Div. of Merck & Co, Inc. of Rahway, N.J.), pectin, alginate, tragacanath, dextran, and other gums. Derivative polysaccharides contemplated for use herein include cellulose acetates, cellulose nitrates, methylcellulose, and carboxymethylcellulose. Hemi-cellulose polysaccharides contemplated for use herein include d-gluco-d-mannans, d-galacto-d-gluco-d-mannans, and others. Anionic polymers contemplated herein include the alkylcelluloses or carboxyalkylcelluloses, their low- and medium-viscosity alkali metal salts (e.g. sodium carboxymethylcellulose, or "CMC"), cellulose ethers, and nitrocellulose. Examples of such anionic polymers include KLUCEL hydroxypropylcellulose; AQUALON CMC 7L sodium carboxymethylcellulose, and NATROSOL hydroxyethlylcellulose, which are all commercially available from Aqualon Company of Hopewell, VA; ethylcellulose, available from Hercules of Wilmington, Del.; METHOCEL cellulose ethers, available from Dow Chemical Co., Midland, Mich.; and nitrocellulose, which is also available from Hercules.

As is plain from the foregoing and the further disclosure incorporated by reference above, organic binding agents are preferred, although inorganic binding agents are also contemplated for use herein.

A practical upper limit to the amount of binding agents used is contemplated to be that amount which materially interferes with the conductivity of the resulting conductive coatings by diluting the conductive solids in the composition after it is deposited as a film.

Dispersing Agent

Another component of some of the present compositions is an anionic dispersing agent. The anionic dispersing agent has a molecular weight less than about 1000 Daltons, so it is a substantially smaller molecule than the binding agent.

The anionic dispersing agent has a hydrophobic end and a hydrophilic (anionic) end. It functions by surrounding the bound carbon particles and causing the bound particles to disperse. It is believed that the hydrophobic end of each anionic dispersing agent is attracted to the hydrophobic region of the binding agent, thereby causing the anionic end of the anionic dispersing agent to stick out into the aqueous surrounding dispersing medium. When each bound carbon particle has sufficient dispersing agent bound to it, the sphere of anionic charges surrounding each particle causes the particles to repel one another, and thus to disperse.

The amount of anionic dispersing agent contemplated for the purposes of the present invention is an amount sufficient to cause the bound carbon particles to disperse in the aqueous dispersing medium. For example, the anionic dispersing agent may be present as from about 0% to about 10% by weight, alternatively from about 0.01% to about 5% by weight, alternatively from about 0.1% to about 2% by weight of the composition. A practical upper limit to the amount of anionic dispersing agents used is contemplated to be that amount which materially interferes with the conductivity of the resulting conductive coatings by diluting the conductive solids in the composition after it is deposited as a film.

Suitable anionic dispersing agents include acrylic latices, aqueous solutions of alkali metal polyacrylates, and similar materials. Some of the previously defined binding agents of the present invention which have an anionic character are also contemplated to be suitable as the anionic dispersing agent herein.

Specific dispersing agents contemplated herein include ACRYSOL I-1955 and ACRYSOL I-545 dispersing agents, both of which are commercially available from the Rohm and Haas Co., Philadelphia, Pa. The ACRYSOL dispersing agents may be used alone or together, preferably together. A preferred weight ratio of ACRYSOL I-1955 to ACRYSOL I-545 is about 1:4.

Surfactants

An optional component of some of the compositions of the present invention is a surfactant. One function of the surfactant is to decrease the surface tension of the aqueous dispersing medium, so the aqueous dispersing medium containing the dispersed carbon particles is able to freely penetrate into the recesses. A second function of the surfactant is to wet the surfaces of the polymeric and glass substrates. This facilitates the coating of these surfaces with the carbon dispersion.

The amount of surfactant that is used in any particular case will vary depending upon the surfactant itself. The composition typically contains from about 0.01% to about 10% by weight, or from about 0.02% to about 3% by weight, or from about 0.05% to about 1% by weight of the composition, of the surfactant.

Suitable surfactants for use in the present invention include TRITON X-100, sold by Rohm and Haas Co., Philadelphia, Pa.; MAPHOS 56, sold by Mazer Chemicals, Inc.; TAMOL 819L-43, 850, and 960 anionic surfactants, available from Rohm and Haas Co., Philadelphia, Pa.; FLUORAD® FC-120, FC-430, FC-431, FC-129, and FC-135 anionic fluorochemical surfactants; sold by Minnesota Mining & Manufacturing Co., St. Paul, Minn.; DARVAN No. 1, sold by R. T. Vanderbilt Co.; ECCOWET LF, sold by Eastern Color and Chemical; PETRO ULF, sold by Petro Chemical Co. Inc.; POLYTERGENT B-SERIES surfactant, sold by Olin Corporation; and others. Cationic and other surfactants may also be used, depending upon the pH and other characteristics of the composition.

Aqueous Dispersing Medium

Another component of the compositions of the present invention is an aqueous dispersing medium. The phrase, "aqueous dispersing medium," as used herein, includes any solvent that is from 80 to 100% water wherein the balance of the material is a water soluble composition. Typical water soluble compositions include the low molecular weight alcohols, such as methanol, ethanol, and isopropanol. Additional solvents such as dimethylsulfoxide, tetrahydrofuran, and ethylene or propylene glycol may also be used. Alternatively, the aqueous dispersing medium may be 100% water. Deionized water is preferred.

The resulting composition is a carbon dispersion that is capable of depositing a uniform, low resistivity coating of carbon particles on the non-conductive surfaces of a through hole. The composition of the present invention may be used "as is," or it may be sold in concentrate form and then diluted up to tenfold (10:1), preferably up to fourfold (4:1), at the point of use. The composition may be diluted with an aqueous dispersing medium, which may include one or more of a buffer, a dispersing agent, a surfactant, or other ingredients.

Process of Treating Recesses

The present invention can be used for electroplating a conductive metal layer, such as copper, to the surface of a non-conductive material. In particular, this process comprises:

(a) preparing any of the liquid dispersions of carbon, as described previously, which are capable of uniformly depositing a coating of carbon on the non-conductive surface;

(b) applying the liquid dispersion to the non-conductive surfaces of a through hole or another non-conductive substrate to form a dispersion coating thereon;

(c) after contacting the substrate with a carbon dispersion and before drying it according to the present process, fixing the coating;

(d) optionally, separating substantially all of the aqueous dispersing medium from the carbon particles, typically by drying the dispersion, so the carbon particles are deposited on the non-conductive surface in a substantially continuous layer; and (e) electroplating a substantially continuous metal layer over the carbon particles deposited on the non-conductive surface.

Although rinsing, cleaning, conditioning, adhesion promotion, and microetching steps are not mentioned above, it is within the scope of the present invention to include one or more such steps, as well as other useful steps. A more detailed description of several of the steps of the present process follows.

Process Lines

The present process can be carried out in a variety of equipment. Two common types of equipment are vertical or dip process equipment, in which the reagents are in stationary baths into which the vertically-disposed boards are sequentially dipped, and conveyorized or horizontal equipment in which the boards are flooded or sprayed with the respective reagents while disposed and travelling substantially horizontally. Either type of equipment, or any combination of the two types of equipment, may be used within the scope of the present invention. Ultrasonic energy may be used in the process baths to improve performance.

Cleaning

Commonly, the first step of the present process is, or includes, cleaning the substrate which is to be plated. In the cleaning step, the substrate is thoroughly wetted and contaminants such as grease, oil, or dirt are removed from the substrate which is to receive plating. The board is cleaned by contacting it with an alkaline aqueous solution or dispersion of a surfactant, which preferably is either cationic or nonionic.

Conditioning

In the conditioning step, the substrate is contacted with a conditioning agent, which is a substantive material, commonly a cationic material such as a polyamidoamine, a cationic polymer, a cationic surfactant, or the like. The conditioning agent is applied as an adhesion promoter so the substrate will be attractive to the anionic particles of carbon which are later applied by contacting the substrate with a carbon dispersion.

Cleaning/Conditioning

As an alternative to separate cleaning and/or conditioning steps, these two steps can be combined into one.

A board to be processed commonly is dip-processed in the cleaning/conditioning solution for 4–6 minutes at 130° to 140° F. (54° to 60° C.). A board is commonly cleaned and conditioned in a conveyorized process by flooding it at a similar temperature for a similar time. These conditions may need to be modified to suit a given situation.

It is desirable, after a combined cleaning/conditioning treatment, to rinse the board in a water bath before contacting the substrate with the carbon dispersion.

Rising

Rinsing steps are optionally added between various reagent baths to prolong the life of the subsequent reagent baths. Typically, the rinsing medium is plain or deionized water. For example, if cleaning and conditioning steps are separately carried out, it is common to insert a water rinse step between the cleaning and conditioning steps.

Water rinsing may be carried out by flooding, dipping, or spraying, as appropriate, and can be carried out at a temperature the same as one of the temperatures at which the preceding or following steps are carried out, at an intermediate temperature (to provide a temperature transition), or at a different temperature (most simply, at room temperature). The rinsing time may vary—1–2 minutes at room temperature is a common rinsing time. Rinsing may be more or less aggressive. More aggressive rinsing may be carried out with mechanical scrubbing or by means of a high pressure spray. Less aggressive rinsing may constitute merely soaking the substrate in the rinsing medium without mechanical action.

Adhesion Promotion

The conductive coating can be formulated as described above to adhere directly to a non-conductive substrate, without the need for a separate adhesion promoter to aid the adhesion of the conductive coating.

In an alternative embodiment, adhesion of the conductive coating to a substrate can be promoted by incorporating a binding agent in the conductive carbon composition.

As another alternative, one or more adhesion-promoting ingredients can be separately formulated in a cleaning, conditioning, rinsing, or adhesion-promoting composition which is applied to the substrate before, after, or at the same time as the conductive composition is used. Conditioners and binding agents thus can be formulated separately, instead of or in addition to putting the conditioners and binding agents in the conductive composition per se. For example, a liquid dispersion can be provided comprising from about 0.01 to about 10% by weight of a water dispersible organic binding agent in an aqueous dispersing medium. The binding agent dispersion can be applied to said non-conductive surface, forming a binding agent coating thereon.

All these adhesion-promoting methods and compositions are regarded to be part of the present invention, whether the adhesion promoter is formulated and applied with the conductive composition or in a separate composition.

The adhesion promoter can be applied in a dip or conveyorized process, within the scope of the present invention.

Conductive Coating

After the substrate is cleaned and conditioned, and (optionally) before or after adhesion to the substrate is promoted, the non-conductive surfaces of one or more recesses are contacted with a liquid carbon dispersion as previously described. The carbon dispersions described in U.S. Pat. No. 5,139,642 (which patent is incorporated here in its entirety by reference), as well as those described here, can be used within the scope of the present process invention.

The carbon dispersion is applied from a bath or by flooding in most instances. A dip time of 4–6 minutes at 90° F. (32° C.) is typical for a dip process, and a process time of about 20 to 60 seconds is typical for a conveyorized process, though other times and temperatures may be appropriate.

Fixing

After contacting the substrate with a carbon dispersion and before drying it according to the present process, one may employ a fixing step. The fixing step is important in the treatment of printed circuit boards, since it makes the carbon dispersion more workable. Fixing may be accomplished in at least two different ways, referred to here as the chemical fixing method and the physical fixing method.

The chemical fixing method can be carried out by applying a fixing solution to the surfaces which have been wetted by the carbon dispersion. The fixing solution removes excessive carbon composition deposits, is believed to crosslink the first monolayer of carbon which is directly attached to the substrate, may crosslink or precipitate a binding agent associated with the carbon, and thus smooths the carbon coating on the recess surfaces by eliminating lumps and by making the coating more uniform.

In the chemical fixing step, the fixing solution may be water, aliphatic or aromatic solvents, or a dilute aqueous acid, salt, or other solute. If water is used, the water desirably is warm (120–140° F., 49–60° C.) to effect fixing. Many dilute solutions are capable of fixing the bound carbon at room temperature or warmer. Fixing is typically accomplished by a 30–60 second exposure of the carbon coating to the fixing solution. While not wishing to be bound by any theory, it is believed that the dilute acid fixer works, particularly when a polysaccharide such as sodium carboxymethylcellulose or a starch is the binder, by neutralizing or crosslinking the carboxyl groups, thereby causing the dispersed and bound carbon particles to precipitate on the recess bore.

Typical acid fixing solutions include dilute aqueous solutions containing from 0.1–5% by volume of an acid. Convenient acids useful herein include mineral acids, such as hydrochloric, phosphoric, nitric, or sulfuric acid. Organic carboxylic acids, such as acetic acid, citric acid, fumaric acid, oxalic acid, and others may also be used. A specifically contemplated fixing solution is a dilute aqueous solution of sulfuric acid, such as an aqueous solution containing 0.1–2% sulfuric acid by volume. Acidic fixing solutions that contain less than 0.1% acid may require some heat to effect fixing within the typical 30–60 second exposure.

An acid fixing bath contemplated for use herein contains sufficient acid to provide a pH of from about 0.01–6, alternatively from about 0.1 to about 4, alternatively about 0.7, which may be provided by using from about 0.1 to about 0.5% by volume of concentrated sulfuric acid in deionized water. The normality of the acid may be from 0.07N to 0.17N, alternatively from 0.01N to 1.0N, alternatively from 0.001N to 5N. The bath may be used at room temperature (for example, about 70° F. or 20° C.), or alternatively at from about 125° to about 135° F. (from about 52° to about 57° C.).

Alkaline aqueous fixing solutions are also contemplated herein. Exemplary alkaline solutions are alkali metal or ammonium bicarbonates such as sodium bicarbonate, alkali metal or ammonium carbonates such as sodium or potassium carbonate.

Fixing may be accomplished with a dilute aqueous solution of a dilute carbonate/bicarbonate or other buffer. For example, a solution in deionized water of 3 g of potassium carbonate and about 1 g of potassium bicarbonate per liter of solution may be used for fixing. Buffered fixing solutions may be provided having a pH of 4, 5.5, 7, or 10.

Aqueous solutions of organic or inorganic salts are also contemplated as fixers. Some examples are ammonium or alkali metal (e.g. sodium) sulfates, ammonium or alkali metal (e.g. sodium) acetates, or ammonium or alkali metal (e.g. sodium) oxalates.

Yet another category of fixing solutions are materials which crosslink or flocculate the particular binding agent employed (here referred to in either case as a "crosslinking agent"). For example, polysaccharides (carboxymethylcellulose, starch), polyvinyl alcohols, and other binding agents can be crosslinked using cationic crosslinking agents such as the following:

| LIST OF ORGANIC CROSS LINKING AGENTS FOR POLYSACCHARIDES SUCH AS: CMC, STARCH, PVA, etc | | |
|---|---|---|
| Trade Name | Vendor | Chemical Name |
| POLYCUP | Hercules | Polyamide-Epichlorohydrin |
| CALLAWAY 6818 | Exxon Chemicals | Amino Polyamide Epichlorohydrin |
| CALLAWAY 7173 | Exxon Chemicals | Amino Polyamide Epichlorohydrin |
| CALLAWAY 6817 | Exxon Chemicals | Amino Polyamide Epichlorohydrin |
| CALLAWAY 6819 | Exxon Chemicals | Amino Polyamide Epichlorohydrin |
| CALLAWAY 6831 | Exxon Chemicals | Amino Polyamide Epichlorohydrin |
| SANDOLEC CF | Sandoz Chemical | Polyamino Amine |
| SANDOLEC CL | Sandoz Chemical | Quaternized Polyimidazoline |
| SANDOLEC CW | Sandoz Chemical | Methylene Guanidine |
| SANDOLEC CT | Sandoz Chemical | Polyamine |
| SANDOLEC CS | Sandoz Chemical | Alkylene Guanidine |
| MAGNIFLOC 496C | Cyanamid | Polyacrylamide |
| CYASTAT SP | Cyanamid | Quaternary Ammonium Compound |
| CYASTAT LS | Cyanamid | Quaternary Ammonium Compound |
| CYASTAT SN | Cyanamid | Quaternary Ammonium Compound |
| ARKLEAR 1055 | Aquaness Chemical | Polyamine |
| ARKLEAR 155 | Aquaness Chemical | Polymerized Amine |
| DAXAD CP-2 | W.R. Grace Co. | Dimethylamine Ethylene Diamine Epichlorohydrin |
| DENSEFLOC 30 | Garden Chemical Co. | Polymeric Flocculant |
| POLYTEC 65 | Polytech Inc. | Polyarylamide Copolymer |
| POLYTEC 98 | Polytech Inc. | Polyarylamide Copolymer |
| ETHOMEEN C12 | Armak Chemicals | Tertiary Amine |
| ETHOMEEN C15 | Armak Chemicals | Tertiary Amine |
| ETHOMEEN S12 | Armak Chemicals | Tertiary Amine |
| ETHOMEEN T12 | Armak Chemicals | Tertiary Amine |
| ETHOMEEN U12 | Armak Chemicals | Tertiary Amine |
| ETHOQUAD 18/12 | Armak Chemicals | Polyethoxylated Quaternary Ammonium Chloride |
| ETHOQUAD C12 | Armak Chemicals | Polyethoxylated Quaternary Ammonium Chloride |
| ETHOQUAD O12 | Armak Chemicals | Polyethoxylated Quaternary Ammonium Chloride |
| ARQUAD 1233 | Armak Chemicals | N-Alkyl Trimethyl Ammonium Chloride |
| ARQUAD 1250 | Armak Chemicals | N-Alkyl Trimethyl Ammonium Chloride |
| ARQUAD 1850 | Armak Chemicals | N-Alkyl Trimethyl Ammonium Chioride |
| ARQUAD T50 | Armak Chemicals | N-Alkyl Trimethyl Ammonium Chioride |
| ARQUAD B100 | Armak Chemicals | Alkyl Methyl Benzyl Ammonium Chloride |

Fixing may be carried out using a dilute aqueous solution of sodium carboxymethylcellulose (e.g. about 2–5 g/l). Diverse other fixing solutions include the following:

| LIST OF SHADOW FIXER FORMULATIONS | |
|---|---|
| Dihydroxyaluminum Sodium Carbonate | 1 g/l |
| Potassium Sorbate | 1.4 g/l |
| Propylene Glycol | 4 g/l |
| Fumaric Acid | 1.0 g/l |
| | pH 3.6 |
| Dihydroxyaluminum Sodium Carbonate | 4 g/l |
| Sulfuric acid conc. | 16 ml/l |
| Citric Acid | 10 g/l, pH 2.6 |
| | 13Ω |
| Fumaric Acid | 4 g/l, pH 2.7, 20Ω |
| Aluminum Ammonium Sulfate | 1 g/l |
| EDTA | 1 g/l |
| Conc. Sulfuric Acid | 2.5 ml/l |
| Polycop 172 | 5 ml/500 ml |
| | 140° F. |
| Polycop 172 | 1 ml/500 ml |
| Conc. Sulfuric Acid | 2 ml/l |
| | 6Ω |
| Aluminum Acetate | 1 g/l |
| | 32Ω |
| | 130° F. |
| Conc. Sulfuric Acid | 5% v/v |
| Conc. Hydrochloric Acid | 5% v/v |
| Hydrochloric Acid | 2 ml/l |
| Palladium Chloride | 1 g/l |
| Aniline Chloride | 10 g/l |
| Lithium Silicate | 100 ml/l |
| Hydrochloridic Acid | 2 ml/l |

In the formulations given above, the resistance in ohms is the side-to-side resistance of a printed wiring board, measured as described in this specification after using the fixer specified.

The fixing step may be carried out in a vertical process in about 30–60 sec at 130° F. (54° C.), in one embodiment. The fixing step may also be carried out by using flooding or spraying processes, particularly in a horizontal or conveyorized embodiment.

In the physical fixing method, the recesses or other substrates which have been wetted with the carbon dispersion are subjected to a mechanical force which removes excess deposits of the carbon coating before it is dried. The mechanical force may be applied in a wide variety of ways, within the scope of the present invention.

One contemplated embodiment of this mechanical force is the action of a fluid jet contacting the surfaces which have been coated with the carbon dispersion. In a more specific embodiment, the fluid jet can be a jet of air or another gas directed through the recesses which have been treated with the carbon dispersion to blow away any excess accumulations of the carbon deposit, and particularly any occlusions of the carbon dispersion which can in some instances block the recesses.

In a practical printed wiring board fabrication line, the air jet can be provided in the form of an "air knife"—a curtain of moving air. The curtain is formed of air or another gas travelling perpendicular to the surface of the wiring board, through which the wiring board is passed to blow out the recesses and thus fix the carbon dispersion. The air pressures contemplated for use in an air knife process are typically 3–4 psi—2–3 $N/cm^2$—or more broadly from less than 3 psi (2 $N/cm^2$) to 30 psi (20 $N/cm^2$) or more. The curtain of air may also be heated, thus further assisting in drying the substrate. Alternatively, air from a source nominally at 50 psi (35 $N/cm^2$), held at or near room temperature, can be directed against the printed wiring board to blow out excess material in through holes.

In a particular embodiment of the invention, any of these fixing steps may be used with a carbon dispersion which lacks all the adjuvants of the carbon dispersion specified in the present composition inventions which are not essential to maintain the stability of the dispersion.

Without intending to be bound by the accuracy of the present theory, the inventors contemplate that fixing provides one or more of the following benefits:

reducing excess deposits of the carbon dispersion, preferably providing substantially a monolayer of carbon particles; or crosslinking the binding agent, such as a sodium carboxymethylcellulose or polysaccharide binding agent, of the remaining carbon coating to better bind the carbon to the non-conductive surface, while still allowing the carbon coating to be microetched away from any metallic surfaces (such as copper cladding) which are present.

It is surprising that a crosslinked coating of this nature can improve adhesion of the coating without interfering with microetching.

Drying

After the carbon dispersion is applied and fixed, the carbon-coated portion of the substrate typically is dried, thus depositing a dry carbon coating on the substrate. Drying is understood to more fully crosslink the carbon coating, as well.

The substrate may be dried in an oven. Drying may be accomplished by using heated air (in the fixing step or later), by employing heat lamps or other radiant heat sources, by simple air drying at ambient temperature, or by other drying techniques. A skilled person is readily able to devise an appropriate method of drying the substrate. Typical drying conditions might be oven-drying for 15 to 18 minutes at 140° to 180° F. (60–82° C.). The method described in U.S. Pat. No. 5,139,642 may also be employed.

Microetching

When the recesses of printed wiring boards are being prepared for plating, the boards normally are already copper clad. The typical processes for treating the non-conductive surfaces incidentally contact the copper-clad surfaces with the various recess treating reagents, including the carbon dispersion. It commonly is desirable to remove the carbon dispersion coating and other residues from the already copper-clad surfaces of the printed wiring board before the recesses of the board are electroplated. One such removal process contemplated here is called microetching.

Microetching is carried out by exposing the carbon-coated printed wiring board to an etchant which removes a slight amount of copper from the copper clad surfaces of the substrate, without appreciably attacking the carbon coating on the non-copper-clad surfaces. The carbon coating typically is sufficiently porous to allow the underlying copper layer to be attacked. When the underlying surface to which the carbon deposit adheres is microetched, the carbon deposit flakes away from the copper-clad surfaces while remaining intact in non-copper-clad areas, such as the recess walls.

Microetching compositions are conventionally used in connection with carbon dispersion coating processes. One example of a known formulation is bath 9 described in column 17, lines 19–28, of U.S. Pat. No. 5,139,642, which is incorporated here by reference.

Microetching compositions may be deployed by clipping the substrate in a microetch bath or by spraying the substrate with a microetch composition.

After microetching, the substrate is preferably rinsed to remove residual flakes of carbon and to maintain the integrity of the subsequent reagents. The rinse may be carried out by immersing the substrate in a bath, by spray rinsing the substrate, or otherwise.

The result of microetching is that the originally copper clad surfaces are freed of the carbon deposit, while the recess walls retain the deposit and thus remain conductive. The copper-clad surfaces thus can form low-resistance connections with the plating electrodes when the recesses are electroplated.

Drying

After the recesses are made conductive as described above, they are commonly dried prior to electroplating. Drying may again be carried out in any of the conventional ways known to those skilled in the art, such as those described previously.

Electroplating

Electroplating of recesses may be carried out essentially conventionally. The electroplating processes described below and other processes known to those skilled in the art, including the particular process employed in U.S. Pat. No. 5,139,642, from col. 17, line 43, to column 18, line 5, may be used.

Result of Plating Process

When the plating process is complete, the deposited plating is resistant to pullaway (which resembles a blister in the plating) and other adhesion defects, even when the most severe thermal shock tests are performed. For example, the continuous metal layer can be coated with molten solder, forming soldered continuous metal layer which is substantially free of voids and pullaway.

Printed Wiring Boards

The present invention allows the manufacture of a printed wiring board having conductive recesses. Such boards are made by applying any of the compositions described above to a printed wiring board, optionally having one or more recesses, in accordance with any of the methods described above. The printed wiring board may have more than one conductive coating, but preferably has a single coating provided by a one-pass coating process, which provides the recesses with adequate conductivity for electroplating. This printed wiring board is then electroplated to provide a printed wiring board having copper clad recesses.

The present process may be used with a wide variety of different technologies for printed wiring board fabrication.

In conventional printed wiring board fabrication, through holes (holes extending through a printed wiring board from one side to the other) or vias (blind holes) are drilled into a metal-clad non-conductive board, and the present method is used to provide a conductive coating on the non-conductive through hole or via walls.

The present method can also be used to fabricate printed wiring boards using other technology. For example, in photoimageable dielectric (PID) fabrication, isolated conductive regions such as circuit lines are formed on a printed wiring board, then covered with an imageable dielectric coating which is selectively etched away to once again expose selected portions of the isolated conductors which are to be connected by interconnects. Interconnects are then formed by applying the present composition to the surface of the imaged dielectric coating, then electroplating the coated surface with copper to provide a copper interconnect.

In resin-coated copper technology, an imaged copper interlayer is covered with a resin dielectric which is then cut with a laser or plasma cutting tool, providing very small diameter (currently as small as 0.75 mil) vias having non-conductive resin walls. These walls can be made conductive, facilitating electroplating to provide interconnects, by applying a coating of a conductive carbon composition according to the present invention. The inventors contemplate that this process can be used without microetching, which is an advantage because the metallic floors of small-diameter recesses made as described here are difficult to reach with microetching solution. This process also has an advantage over electroless copper technology, as electroless copper chemicals can form gas bubbles which can occlude small-diameter vias or recesses. The present compositions do not generate gas.

The present invention can also be used to make an entirely nonconductive surface electrically conductive, as when no conductive portions at all are initially present. In this instance, microetching is unnecessary, as no preexisting metal conductors are covered when the carbon composition is applied.

Resistance Measurements

The resistance of a printed wiring board which has been treated to make selected surfaces conductive is measured as an indication of the amount of time which will be required to electroplate the coated surfaces. The lower the resistance, the more rapidly electroplating can proceed. The resistance of the through holes of a double-sided circuit board is conventionally measured by measuring the resistance between the two metal-clad surfaces on opposite ends of the through holes. Thus, one through hole resistance value is obtained for an entire printed wiring board before electroplating proceeds.

A single printed wiring board commonly has many through holes of varying diameters. The number of through holes depends upon the size of the circuit board and the particular circuit it will carry. For example, a typical 18 inch by 24 inch (46 cm by 61 cm) board may have 3000 holes with diameters varying from about 6 mils (0.15 mm) to about 0.25 inch (6 mm). Also, a board may have a thickness of from about 1 mil (25 microns) to about 0.25 inch (6 mm.). Multiple through holes create parallel conductive paths, so the net resistance of all the through holes on the board is less than the resistance of one through hole. The more electrically interconnected through holes there are, the lower the resistance, other things being equal. The diameter of the through hole determines the cross-sectional area of its conductive surface, so a larger diameter through hole has a lower resistance than a smaller diameter through hole, other things being equal. The thickness of the board determines the length of each conductive through hole. The thicker the board, the longer each through hole and the higher its resistance, other things being equal.

Finally, "other things" are not equal, so even if the number and dimensions of the through holes are known, the resistance of each through hole cannot be directly calculated with any accuracy. Different through holes on the same board may have different coating thicknesses, the coating is applied on an irregular bore surface, fluid circulation in a bath to the various holes is different, and so forth.

One can also determine the resistance of a single through hole. This can be done in at least two ways. One way is to coat the through hole of a coupon (a sample of metal-clad printed wiring board material which is not intended to be used in a circuit) or an actual printed wiring board which has only a single through hole, so the resistance of the board is the same as the resistance of that through hole. A second way is to isolate one through hole electrically by severing the cladding which links other through holes to the through hole which is being measured for resistivity. Thus, where the resistance of a through hole is given in this specification or in the claims, the resistance of a single through hole in electrical isolation, measured before electroplating, is meant.

Notwithstanding these many variations, the industry commonly draws conclusions about the conductivity of the through holes from a single resistance measurement per printed wiring board. For example, the 18 by 24 inch (46 by 61 cm) board referred to previously, coated with the preferred graphite composition according to the present invention in one pass, commonly has a resistivity of about one ohm through its through holes, which rises to about 10 ohms after microetching. The same board coated using the commercially available two-pass BLACKHOLE carbon black process has resistivities more than ten times as great, and sometimes 50 to 70 times as great, as those of the preferred graphite composition. Thus, where the resistance of a printed wiring board is given in this specification or in the claims, or if a resistance is given without specifying the manner of measurement, this single measurement, made prior to electroplating, is meant. Of course, if two boards have identical numbers, patterns, and sizes of through holes, the resistances of the entire boards can be directly compared to obtain useful results.

Extending resistance measurements to vias, whether drilled, laser cut, or otherwise formed, the same principles generally apply. Where a printed wiring board or other substrate has isolated metallic conductors bridged by a carbon composition of the present invention, the resistance between the isolated metallic conductors can be measured to determine the conductivity improvement resulting from application of the present conductive carbon compositions.

When the present invention is used to improve the through hole or via conductivity of an entire printed wiring board, the board has an electrical resistivity of less than about 1000 ohms, optionally less than about 600 ohms, optionally less than about 400 ohms, optionally less than about 250 ohms, optionally less than about 80 ohms, optionally less than about 60 ohms, optionally less than about 30 ohms, optionally less than about 10 ohms, optionally less than about 2 ohms, optionally less than about 1 ohm, each measured prior to electroplating the through hole.

When the present invention is used to improve the conductivity of an individual through hole, the treated through hole has an electrical resistivity of less than about 5000 ohms, optionally less than about 1000 ohms, optionally less than about 600 ohms, optionally less than about 400 ohms, optionally less than about 250 ohms, optionally less than about 80 ohms, optionally less than about 60 ohms, optionally less than about 30 ohms, optionally less than about 10 ohms, each measured prior to electroplating the through hole.

Coating Uniformity Determination

A thin, uniform coating of the carbon composition on the through holes is important so the plating which is deposited on the coating will not suffer from pullaway, particularly when subjected to the thermal shock of soldering. The fixing step is important to provide the necessary uniform, thin coating.

The inventors contemplate that the coating ideally will be nearly as thin as the diameters of the dispersed particles of carbon, so it will form a monolayer of carbon particles. For example, a composition containing one-micron mean diameter particles would provide a film on the order of one micron thick. More particularly, the inventors contemplate a coating of from about one to about three microns thick. Thinner coatings are acceptable until the coating becomes so thin that complete coverage is not obtainable.

The inventors contemplate that coatings more than about 3 microns thick will start to present problems. Pullaway (a place where the plating delaminates) becomes more probable in this thickness range. A region of the coating as thick as about 7 microns is contemplated to be less desirable, while a coating of about 12 microns is contemplated to be still less desirable. When part of the coating becomes as thick as roughly 7 microns, it becomes visible when a 200 power (200× magnification) microscope is used to examine the plated through hole. Thus, another definition of the appropriate coating thickness is a coating which is too thin to see in a plated through hole cross-section under a 200 power microscope.

The degree of uniformity of the coating is sometimes expressed qualitatively by reporting that the coating in question exhibits, or is free of, lumpiness or localized areas having a thick coating of the carbon coating. Lumpiness (if present) typically is found at the entrance or exit of a through hole (i.e. at the corners of a rectangular cross-section of a cylindrical hole), and is manifested as visible (under a 50× microscope) non-uniform areas of plating projecting inwardly from the plane defined by the wall of the through hole bore. Expressed another way, a plated through hole bore is free of lumpiness if the plating appears to be a straight line down each side of the through hole connecting the conductive cladding at each end of the hole, when viewed in cross-section at 50× magnification.

The following examples are provided to describe specific embodiments of the invention and to demonstrate how it works. By providing those specific examples, the inventors do not limit the scope of the invention. The full scope of the invention is all the subject matter defined by the claims concluding this specification, and equivalents thereof. Additional examples and details respecting the practice of the invention may be found from page 58, line 10, to page 104, last line, of U.S. Ser. No. 08/471,871, filed Jun. 7, 1995, now U.S. Pat. No. 5,690,805. That text is hereby incorporated by reference in the present disclosure.

EXAMPLE 1

Fixing After Graphite Dispersion

The following cleaner/conditioner, graphite composition, and fixer solutions were prepared.

Cleaner/Conditioner

A working cleaner/conditioner solution was prepared by diluting one volume of the cleaner/conditioner concentrate sold commercially as SHADOW® cleaner/conditioner 1 by Electrochemicals Inc., Maple Plain, Minn., with nine volumes of DI water. In practice, the working cleaner/conditioner was maintained within the range of 140–160° F. (60–71° C.).

| GRAPHITE COMPOSITION: The following components were provided: | |
|---|---|
| Parts By Weight | Component |
| 263 | Graphite |
| 1029 | Water |
| 36 | potassium carbonate |
| 28 | sodium carboxymethylcellulose |
| 6 | potassium bicarbonate |
| 1.2 | ACRYSOL I-1955 |
| 4.8 | ACRYSOL I-545 |
| 7.4 | FLUORAD FC-120 |

The colloidal graphite, having a particle size of about 1 micron, was combined with the carboxymethylcellulose, TAMOL 819 surfactant, and water, forming a dispersion. 200 g of the colloidal graphite dispersion and 790 g of DI water were mixed, and the mixture was stirred for approximately 20 minutes. To the mixture was then added potassium carbonate (powder) and the mixture was stirred for approximately 15 minutes. Thereafter, potassium bicarbonate crystals were added to the reaction mixture and it was mixed for about 15 minutes. The pH of the mixture was then adjusted to 10.5 with additional potassium bicarbonate or potassium carbonate. When the solution was in the desired pH range, to it were added the acrylic emulsion polymer ACRYSOL® I-1955 and the acrylic emulsion polymer ACRYSOL® I-545 (Rohm and Haas), and the mixture was stirred for approximately 10 minutes. Thereafter, the anionic fluorochemical surfactant FLUORAD® FC-120 was added to the mixture and the mixture was stirred for approximately 40 minutes.

Fixer Bath

Sixteen ml. of concentrated sulfuric acid were added to a sufficient volume of DI water to avoid splattering and then diluted to 4 liters. In practice, the diluted sulfuric acid solution is placed in a fixer bath and heated between 120° F.–140° F. (49–60° C.).

In this Example, three concentrations of the graphite composition are tested on both 2"×2" double-sided ("DS") and multilayer ("ML") coupons. The concentrations tested are "as is," at a two-to-one (2:1) dilution by volume and at an eight-to-one (8:1) dilution by volume.

| LINE MAKEUP FOR GRAPHITE PROCESS |
|---|
| 1) Working Cleaner/Conditioner at 149° F. (65° C.). |
| 2) Rinse-DI water, 15–20 seconds. |
| 3) Graphite composition ("as is," 2:1, or 8:1), 5 minutes, at 75° F. (24° C.). |
| 4) Fixer (when used) |
| 5) Dry |
|    a) blow dry 1–2 minutes. |
|    b) oven dry 15 minutes, at 180° F. (82° C.). |

The Example 1 data shows that the "as-is" composition used here is apparently too concentrated and forms an undesirably thick coating, with or without a fixer. The 2:1 dilution with a fixer provides excellent results—the resistance is low, and 100% surface coverage is obtained (typically providing an excellent, uniform coating of desirable thickness). The 8:1 dilution was found (under the conditions of this test) to provide undesirably low surface coverage (90%) and high resistivity if a fixer was used. The 8:1 dilution without a fixer would typically provide an undesirably non-uniform coating.

EXAMPLE 2

Fixing After Carbon Black Dispersion

Colloidal carbon black having an average particle diameter of about 1 micron is combined with deionized water and an organic dispersing agent, forming a dispersion having a viscosity of about 800 centipoise, a pH of 9.6, and a solids content of 25%. 100 ml of the colloidal carbon black dispersion and 400 ml of DI water are stirred to make a working bath. This carbon black formulation is substituted for the graphite dispersion in the single-pass dip process line described in Example 1. The coated coupon is then fixed with a sulfuric acid solution bath containing 4 ml concentrated sulfuric acid per liter of DI water. The side-to-side resistance is 18 ohms before microetch and 68 ohms after microetch, with very good plating results. This demonstrates the utility of a fixer with a carbon black dispersion.

EXAMPLE 3

Other Fixer Formulations

A variety of other fixer formulations were prepared and tested on the through holes of 2 inch square (5 cm by 5 cm) coupons to demonstrate their utility as fixers in a carbon conductive coating process.

To carry out this work, the following dip process chemicals and conditions were used:

---

LINE MAKEUP FOR GRAPHITE PROCESS

1) Working Cleaner/Conditioner: SHADOW ® Cleaner/-Conditioner IV at 135° F. (57° C.) for 3 minutes.
2) Rinse: DI water at room temperature (about 70° F. or 21° C.) (abbreviated "RT") for 1 minute.
3) Graphite composition: SHADOW ® II, diluted to 4% solids (1:1), at room temperature for five minutes.
4) Fixer: as specified in examples, at room temperature or 135° F. (57° C.) for 30 seconds.
5) Oven Dry for 15 minutes, at 190° F. (88° C.).
6) Microetch: 150 g of sodium persulfate and 10 ml of sulfuric acid per liter of aqueous solution, at room temperature for 1 minute.
7) Rinse: deionized water at room temperature for 1 minute.
8) Acid Cleaner: formulation 17A (Electrochemicals Inc.) at 120° F. (49° C.) for 3 minutes.
9) Rinse: deionized water at room temperature for 1 minute.
10) Acid treatment: aqueous sulfuric acid (10% v/v) at room temperature for 30 seconds.
11) Acid Copper electroplating solution: Electrochemicals PC 667 at room temperature for 2 minutes.
12) Rinse: deionized water at room temperature for 1 minute.
13) Oven Dry for 5 minutes, at 195° F. (91° C.).

---

The processed coupons (which had been plated for two minutes, per step 11 above) were evaluated by backlight and graded on a scale of 1–10, with 10 being the best result. The selected fixer formulations and the resulting resistivity (measured between the drying step 5 and the microetch step 6 of the process) and backlight scores for room-temperature fixing and for fixing at 135° F. (57° C.) are provided in the table for Example 3.

The results for Example 3 show that a wide variety of different aqueous solutions, or compressed air, can be used successfully to fix the carbon coating, with the benefits identified previously. Most of the tested materials worked better, respecting this backlight test, than the second material tested in Example 3—tap water at room temperature. Some of the materials provided better results in this test than SHADOW® fixer, a commercial acid fixer having a pH of 2—the first item in the table for Example 3.

| Coupon | Measured Resistivity (ohms) | Comments |
| --- | --- | --- |
| "As is" ML (multilayer board), with fixer | 1.1 | Small holes clogged, surface lumps; poor result |
| "As is" DS (double-sided board), with fixer | 1.2 | Small holes clogged, surface lumps; poor result |
| 2:1 ML, with fixer | 6.5 | 100% surface coverage; excellent result |
| 8:1 ML, with fixer | 336 | 90% surface coverage; good result |
| 8:1 DS, with fixer | 49 | 90% surface coverage; good result |
| "As is" ML, no fixer | 1.1 | Small and large holes clogged, no surface lumps; poor result |
| "As is" DS, no fixer | 0.8 | Small and large holes clogged, no surface lumps; poor result |
| 8.1 ML, no fixer | 7.1 | 100% surface coverage, but non-uniform coating; poor result |
| 8.1 DS, no fixer | 7.5 | 100% surface coverage, but non-uniform coating; poor result |

| FIXER FORMULATION | RESISTIVITY IN OHMS RT | RESISTIVITY IN OHMS 135° F. (57° C.) | BACKLIGHT COVERAGE IN 2 MINS. RT | BACKLIGHT COVERAGE IN 2 MINS. 135° F. (57° C.) |
| --- | --- | --- | --- | --- |
| SHADOW Fixer pH 2.0 | 91,79 | 89,48 | 8.5 | 9.0 |
| Water pH 7.5 | 400,380 | 270,250 | 7.5–8.0 | 8.5–9.0 |
| Sodium Bicarbonate 10 g/l pH 8.2 | 200,300 | 65,87 | 8.0–8.5 | 8.5–9.0 |
| Sodium Carbonate 10 g/l pH 9.5 | N/A | 300,450 | N/A | 8.5–9.0 |
| Sodium Bicarbonate 50 g/l pH 8.5 | N/A | 120,200 | N/A | 8.5–9.0 |
| Sodium Carbonate 50 g/l pH 11.1 | N/A | 500,600 | N/A | 8.5–9.0 |
| Sodium Sulfate 10 g/l pH 7.18 | 27,30 | 24,27 | 9.0 | 9.5 |
| Sodium Sulfate 50 g/l pH 7.0 | 35,25 | 20,21 | 9.0 | 9.5 |
| Ammonium Acetate 10 g/l pH 6.9 | 20,16 | 14,20 | 9.5 | 9.5–9.7 |
| Ammonium Acetate 50 g/l pH 6.5 | 15,18 | 11,18 | 9.5 | 9.5–9.7 |
| Sodium Oxalate 20 g/l pH 7.7 | 100,75 | 40,73 | 9.0–9.5 | 9.5 |
| Sodium Oxalate 50 g/l pH 7.8 | 90,85 | 36,50 | 9.0–9.5 | 9.5 |
| Compressed air ≈ 60 psi (82 N/cm$^2$) | 51,72 | N/A | 9.5 | N/A |
| POLYCUP 736 1 g/l pH 7.0 | N/A | 190,200 | N/A | 8.5 |
| POLYCUP 736 50 g/l pH 5.1 | 600,700 | 10,11 | 4.0–6.0 | 7.0–8.0 |
| HG 930 10 g/l pH 7.5 | 50,85 | 90,70 | 9–9.5 | 9.0 |
| HG 930 50 g/l pH 7.6 | 10,6 | 500,600 | 9–9.5 | 9.0 |
| JAYFLOC 846 water-soluble polymer 1/g/l pH 8.0 | | | | |
| JAYFLOC 840 water-soluble polymer 50 g/l pH 6.4 | 7,5 | 1000,1100 | 4.0–8.0 | 4.0–6.0 |
| CALLAWAY 6818 1 g/l pH 6.2 | N/A | 200,210 | N/A | 9.0 |

-continued

| FIXER FORMULATION | RESISTIVITY IN OHMS | | BACKLIGHT COVERAGE IN 2 MINS. | |
|---|---|---|---|---|
| | RT | 135° F. (57° C.) | RT | 135° F. (57° C.) |
| CALLAWAY 6818 50 g/l pH 3.4 | 230,220 | 360,350 | 9.0 | 8.5–9.0 |

The carbon coating is essentially free of voids when applied according to the present invention.

What is claimed is:

1. A method of applying an electrically conductive carbon coating to a non-conductive surface, comprising the steps of:
   A. providing a substrate having a least one non-conductive surface;
   B. providing a liquid dispersion of electrically conductive carbon having a mean particle size no greater than about 50 microns, present in an amount effective to provide an electrically conductive coating when said dispersion is applied to said non-conductive surface;
   C. applying said carbon dispersion to said non-conductive surface under conditions effective to form a substantially continuous, electrically conductive carbon coating thereon having a resistivity of less than about 1000 ohms;
   D. fixing said conductive carbon coating on said surface; and
   E. electroplating a substantially continuous metal layer over said conductive carbon coating after said fixing step.

2. The method of claim 1, wherein said fixing step is carried out by applying a fixing liquid to said surface.

3. The method of claim 2, wherein said fixing liquid is selected from the group consisting of water, aliphatic solvents, aromatic solvents, dilute aqueous acids and combinations thereof.

4. The method of claim 2, wherein the pH of said fixing liquid is maintained at a value between about 0.1 and about 4.

5. The method of claim 2, wherein said fixing liquid is maintained at a temperature between about 49° C. and about 60° C.

6. The method of claim 2, wherein said fixing liquid is maintained substantially at room temperature.

7. The method of claim 2, wherein said fixing step is carried out by exposing said surface to said fixing liquid for from about 30 to about 60 seconds.

8. The method of claim 1, wherein said fixing step is carried out after said applying step, without an intervening drying step.

9. The method of claim 1, wherein said carbon has a mean particle size of not greater than about 1 micron.

10. The method of claim 1, further comprising the step of applying a liquid dispersion comprising from about 0.01 to about 10% by weight of a water dispersible organic binding agent in an aqueous dispersing medium to said non-conductive surface, forming a binding agent coating thereon.

11. The method of claim 10, wherein said carbon dispersion further comprises said water dispersible organic binding agent, present in an amount effective to bind said carbon particles to said substrate.

12. The method of claim 10, wherein said organic binding agent is an alkali metal carboxymethylcellulose.

13. The method of claim 1, wherein said conductive carbon coating is at most about 12 microns thick.

14. The method of claim 1, wherein said conductive carbon coating is at most about 7 microns thick.

15. The method of claim 1, wherein said conductive carbon coating is at most about 3 microns thick.

16. The method of claim 1, wherein said carbon coating is essentially free of lumpiness.

17. The method of claim 1, wherein said carbon coating is essentially free of voids.

18. The method of claim 1, further comprising the step of coating said continuous metal layer with molten solder, forming a soldered continuous metal layer that is substantially free of voids and pullaway.

19. A method of applying an electrically conductive carbon coating to a non-conductive surface, comprising the steps of:
   A. providing a substrate having at least one non-conductive surface;
   B. providing a liquid dispersion of electrically conductive carbon having a mean particle size no greater than about 50 microns, present in an amount effective to provide an electrically conductive coating when said dispersion is applied to said non-conductive surface;
   C. applying said carbon dispersion to said non-conductive surface under conditions effective to form a substantially continuous, electrically conductive carbon coating thereon having a resistivity of less than about 1000 ohms; and
   D. fixing said conductive carbon coating on said surface by applying a fixing liquid to said surface, wherein said fixing liquid is a dilute aqueous acid maintained at a pH between about 0.01 and about 6.

20. The method of claim 19, further comprising the step of electroplating a substantially continuous metal layer over said conductive carbon coating after said fixing step.

21. The method of claim 20, further comprising the step of coating said continuous metal layer with molter solder, forming a soldered continuous metal layer which is substantially free of void and pullaway.

22. The method of claim 19, wherein the pH of said fixing liquid is maintained at a value between about 0.1 and about 4.

23. A method of applying an electrically conductive carbon coating to a non-conductive surface, comprising the steps of:
   A. providing a substrate having at least one non-conductive surface;
   B. providing a liquid dispersion of electrically conductive carbon having a mean particle size no greater than about 50 microns, present in an amount effective to provide an electrically conductive coating when said dispersion is applied to said non-conductive surface;
   C. providing a liquid dispersion comprising from about 0.01 to about 10% by weight of a water dispersible organic binding agent in an aqueous dispersing medium;
   D. applying said liquid dispersion of a binding agent to said non-conductive surface, forming a binding agent coating thereon;
   E. applying said carbon dispersion to said non-conductive surface to form a substantially continuous, electrically conductive carbon coating thereon;
   F. fixing said conductive carbon coating on said surface, wherein said fixing step is carried out by applying a fixing liquid to said surface, wherein said fixing liquid is a crosslinking agent for said water dispersible organic binding agent; and G. electroplating a substantially continuous metal layer over said conductive carbon coating after said fixing step.

24. A method of applying a conductive graphite coating to a non-conductive surface, comprising the steps of:

A. providing a substrate having at least one recess extending therein, said recess having a non-conductive surface;

B. providing a liquid dispersion comprising electrically conductive synthetic graphite having a mean particle size no greater than about 50 microns, present in an amount effective to provide an electrically conductive coating when said dispersion is applied to said non-conductive surface;

C. applying said graphite dispersion to said non-conductive surface under conditions effective to form a substantially continuous, electrically conductive graphite coating thereon having a resistivity of less than about 1000 ohms;

D. fixing said graphite coating on said surface; and

E. electroplating a substantially continuous metal layer over said graphite coating after said fixing step.

25. A method of applying a conductive graphite coating to a non-conductive surface, comprising the steps of:

A. providing a substrate having at least one recess extending therein, said recess having a non-conductive surface;

B. providing a liquid dispersion of from about 1% to about 7% by weight of electrically conductive graphite having a mean particle size no greater than about 50 microns, present in an amount effective to provide an electrically conductive coating when said dispersion is applied to said non-conductive surface;

C. applying said graphite dispersion to said non-conductive surface under conditions effective to form a substantially continuous, electrically conductive graphite coating thereon having a resistivity of less than about 1000 ohms;

D. fixing said conductive graphite coating on said surface; and

E. eletroplating a substantially continuous metal layer over said graphite coating after said fixing step.

26. A method of applying a conductive graphite coating to a non-conductive surface, comprising the steps of:

A. providing a substrate having at least one recess extending therein, said recess having a non-conductive surface;

B. applying from about 0.01% to about 10% by weight of a water dispersible organic binding agent in an aqueous dispersing medium to said non-conductive surface;

C. providing a liquid dispersion of electrically conductive graphite having a mean particle size no greater than about 50 microns, present in an amount effective to provide an electrically conductive coating when said dispersion is applied to said non-conductive surface;

D. applying said graphite dispersion to said non-conductive surface under conditions effective to form a substantially continuous, electrically conductive graphite coating thereon having a resistivity of less than about 1000 ohms;

E. fixing said conductive graphite coating on said surface; and

F. electroplating a substantially continuous metal layer over said graphite coating after said fixing step.

27. A method of applying an electrically conductive carbon coating to a non-conductive surface, comprising the steps of:

A. providing a substrate having at least one non-conductive surface;

B. providing a liquid dispersion of electrically conductive carbon having a mean particle size no greater than about 50 microns, present in an amount effective to provide an electrically conductive coating when said dispersion is applied to said non-conductive surface;

C. applying said carbon dispersion to said non-conductive surface under conditions effective to form a substantially continuous, electrically conductive carbon coating thereon having a resistivity of less than about 1000 ohms; and D. fixing said conductive carbon coating on said surface by applying a fixing liquid to said surface, wherein said fixing liquid is selected from the group consisting of alkaline aqueous fixing solutions, aqueous solutions of organic or inorganic salts, and combinations thereof.

28. A method of applying a conductive graphite coating to a non-conductive surface, comprising the steps of:

A. providing a substrate having at least one recess extending therein, said recess having a non-conductive surface;

B. providing a liquid dispersion comprising electrically conductive synthetic graphite having a mean particle size no grater than about 50 microns, present in an amount effective to provide an electrically conductive coating when said dispersion is applied to said non-conductive surface;

C. applying said graphite dispersion to said non-conductive surface under conditions effective to form a substantially continuous, electrically conductive graphite coating thereon having a resistivity of less than about 1000 ohms; and D. fixing said conductive graphite coating on said surface by applying a fixing liquid to said surface, wherein said fixing liquid is a dilute aqueous acid maintained at a pH between about 0.01 and about 6.

* * * * *